United States Patent
Irarrazabal et al.

(10) Patent No.: US 6,404,194 B1
(45) Date of Patent: Jun. 11, 2002

(54) THREE DIMENSIONAL MAGNETIC RESONANCE IMAGING USING SPIRAL TRAJECTORIES IN K-SPACE

(75) Inventors: Pablo Irarrazabal, Stanford; John M. Pauly, San Francisco, both of CA (US)

(73) Assignee: The Board of Trustees of the Leland Stanford Junior University, Stanford, CA (US)

(*) Notice: Subject to any disclaimer, the term of this patent is extended or adjusted under 35 U.S.C. 154(b) by 0 days.

(21) Appl. No.: 08/286,762

(22) Filed: Aug. 5, 1994

(51) Int. Cl.$^7$ ................................................. G01V 3/00

(52) U.S. Cl. ........................................ 324/307; 324/309

(58) Field of Search ................................ 324/300, 307, 324/306, 309, 312, 314; 128/653.2, 653.3

(56) References Cited

U.S. PATENT DOCUMENTS

| | | | | |
|---|---|---|---|---|
| 5,057,776 A | * | 10/1991 | Macouski | 324/309 |
| 5,122,747 A | * | 6/1992 | Riederer | 324/312 |
| 5,122,748 A | * | 6/1992 | Oh et al. | 324/309 |
| 5,258,711 A | * | 11/1993 | Hardy | 324/309 |
| 5,270,653 A | * | 12/1993 | Pauly | 324/309 |
| 5,304,931 A | * | 4/1994 | Flamig et al. | 324/309 |
| 5,349,294 A | * | 9/1994 | Kasuboski | 324/309 |
| 5,532,595 A | * | 7/1996 | Lampman et al. | 324/309 |

FOREIGN PATENT DOCUMENTS

| | | | |
|---|---|---|---|
| EP | 0412819 | * | 2/1991 |

OTHER PUBLICATIONS

Macovski, "Volumetric NMR with time–Varying Gradients", Mag. Res. in Med. vol. 2, pp. 29–40, (1985).*

Pauly et al, "A Three Dimensional Spin echo or Inversion Pulse", Mag. Res. in Med. vol. 1, pp. 2–6 (1993).*

Ra et al, "Application of Single Shot Spiral Scanning for Volume Localization", Mag. Res. in Med. vol 17, pp. 423–433 (1991).*

Webb et al, "A Fast Spectroscopic Imaging method using a Blipped Phase Encoding Gradient", Mag. Res. in Med., vol. 12, pp. 306–315 (1989).*

Nishimura et al., Magnetic Resonance Angiography, IEEE Trans. on Medical Imaging, vol. MI–5, No. 3, Sep. 1986, pp. 140–151.

Meyer et al., Fast Spiral Coronary Artery Imaging, Magnetic Resonance in Medicine, vol. 28, 1992, pp. 202–213.

Meyer et al., Simultaneous Spatial and Spectral Selective Excitation, Magnetic Resonance in Medicine, vol. 15, 1990, pp. 287–304.

* cited by examiner

*Primary Examiner*—Louis Arana
(74) *Attorney, Agent, or Firm*—Townsend and Townsend and Crew LLP; Henry K. Woodward

(57) ABSTRACT

Three dimensional magnetic resonance imaging employs spiral trajectories which traverse a volume in k-space. The spiral trajectories can include interleaved planar k-space trajectories which are axially rotated as in projection-reconstruction or planar k-space trajectories which traverse parallel planar slices through the volume. The volume can be spherical, ellipsoidal, or defined by generatrices of a family of cones. The scans provide faster coverage of k-space and thus reduce total scan time.

13 Claims, 9 Drawing Sheets

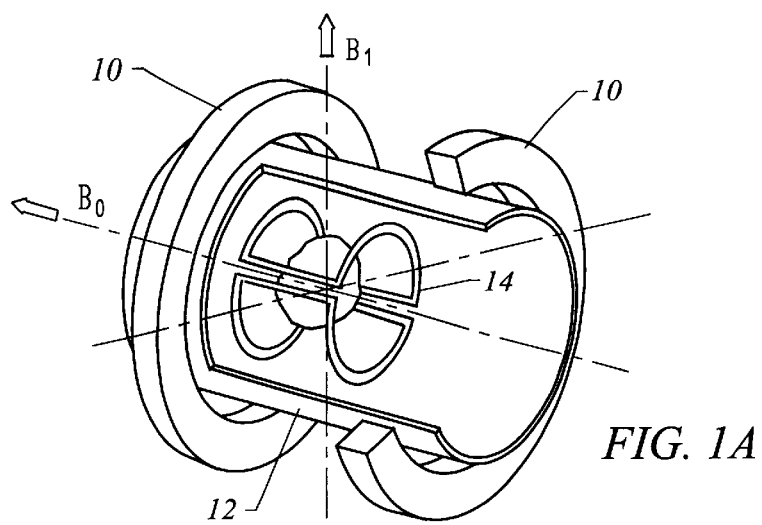
FIG. 1A
FIG. 1B    FIG. 1C    FIG. 1D
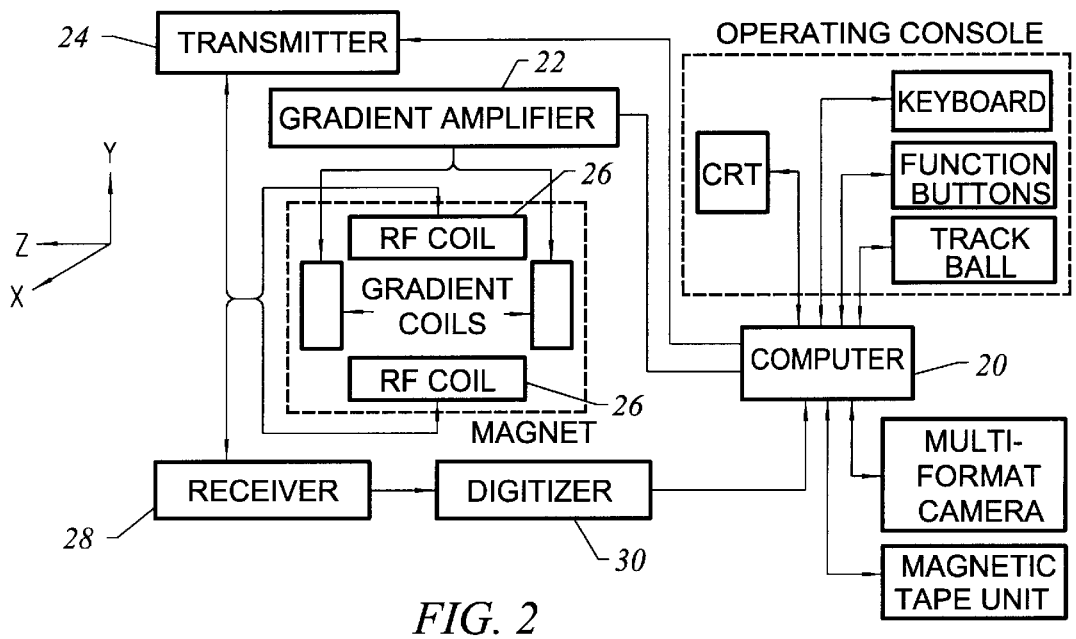
FIG. 2

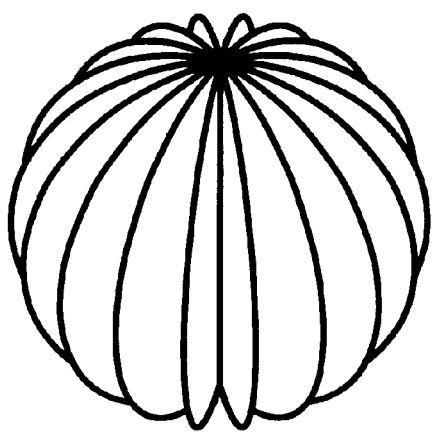 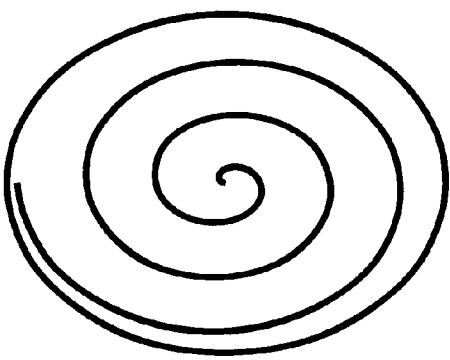
*FIG. 3A*　　　　　　　*FIG. 3B*

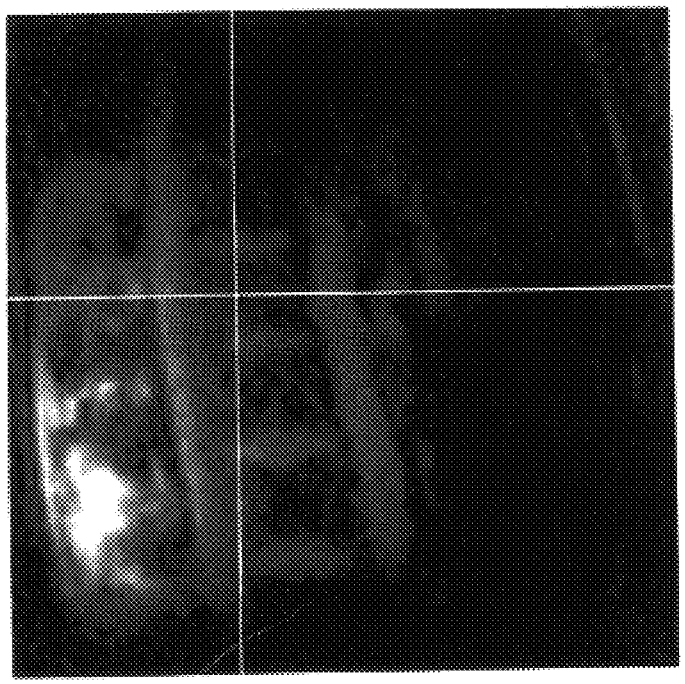
FIG. 4C
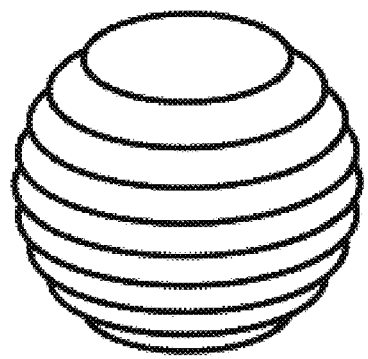 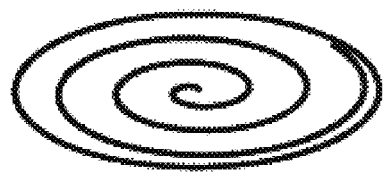
FIG. 5A          FIG. 5B

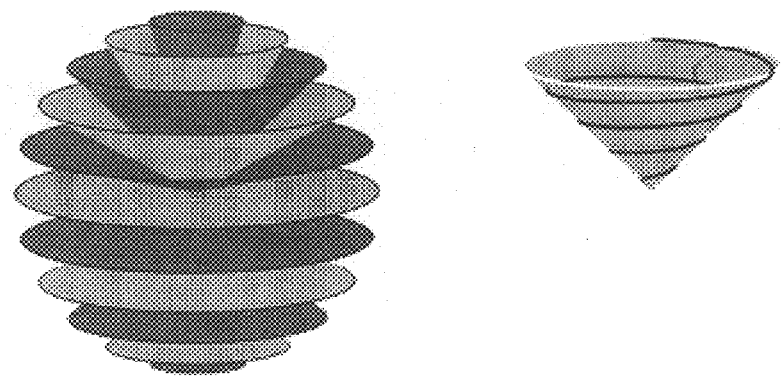
*FIG. 8A*  *FIG. 8B*
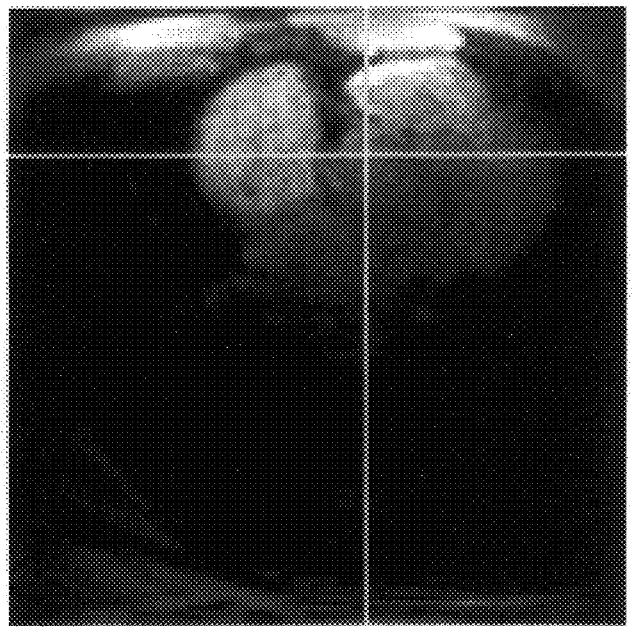
*FIG. 9A*

THREE DIMENSIONAL MAGNETIC RESONANCE IMAGING USING SPIRAL TRAJECTORIES IN K-SPACE

This invention was made with Government support under contract NIH 5RO1 HL 39297 awarded by the National Institutes of Health. The Government has certain rights in this invention.

BACKGROUND OF THE INVENTION

This invention relates generally to magnetic resonance imaging (MRI), and more particularly the invention relates to three dimensional magnetic resonance imaging using spiral trajectories in k-space.

Magnetic resonance imaging apparatus is widely used in medical diagnosis applications. In very general terms, nuclear magnetic moments are excited at specific spin precession frequencies which are proportional to the local magnetic field. The radio-frequency signals resulting from the precession of the spins are received using pick-up coils. By manipulating the magnetic fields, an array signal is provided representing different regions of the volume. These can be combined to produce a volumetric image of the nuclear spin density of the body.

Referring to the drawing, FIG. 1A is a perspective view partially in section illustrating coil apparatus in a MR imaging system, and FIGS. 1B–1D 3illustrate field gradients which can be produced in the apparatus of FIG. 1A. This apparatus is discussed by Hinshaw and Lent, An Introduction to NMR Imaging: From the Block Equation to the Imaging Equation, Proceedings of the IEEE, Vol 71, No. 3, March 1983, pp. 338–350. Briefly, the uniform static field $B_0$ is generated by the magnet comprising the coil pair 10. A gradient field $G_x$ is generated by a complex gradient coil set which can be wound on the cylinder 12. An RF field $B_1$ is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in NMR—A Perspective on Imaging, General Electric Company, 1982. A computer 20 is programmed to control the operation of the NMR apparatus and process FID signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

The strong static magnetic field is employed to line up atoms whose nuclei have an odd number of protons and/or neutrons, that is, have spin angular momentum and a magnetic dipole moment. A second RF magnetic field, applied as a single pulse transverse to the first, is then used to pump energy into these nuclei, flipping them over, for example to 90° or 180°. After excitation, the nuclei gradually return to alignment with the static field and give up the energy in the form of weak but detectable free induction decay (FID). These D\FID signals are used by a computer to produce images.

Magnetic resonance imaging can be planar or two dimensional (2D) or three dimensional (3D). Some of the advantages of using three-dimensional MRI techniques over conventional two-dimensional imaging are that they do not suffer from imperfect slice profiles, and they do not have the same limits for signal-to-noise ratio and spatial resolution. A 3D data set is also conveniently reformatted to allow for new views without the necessity of bringing the patient to the scan room again. Although there are some minor considerations such as storage capacity and processing time, the main reason 3D techniques are not employed more frequently is their long scan times.

Spiral trajectories in k-space have been used in 2D fast imaging. They are especially attractive for the efficiency with which they traverse k-space and for their good properties for flow and motion. See C. Meyer, B. Hu, D. Nishimura and A. Macovski, *Magnetic Resonance in Medicine* 28, 202–213 (1992). To traverse 3D k-space the spiral trajectory is combined with a projection-reconstruction (PR) rotation. The PR as a trajectory also has good flow and motion insensitivity, since the first moments of the gradients are nulled at the origin. See D. Nishimura, A. Macovski and J. Pauly, *IEEE Transactions on Medical Imaging* 5, 3 140–151 (1986).

The new trajectories in accordance with the present invention allow faster coverage of k-space, and therefore reduce the total scan time, making 3D MRI more eficient. This has a direct positive impact on cost with respect to the currently used 3D imaging techniques, like 3DFT, and makes 3D imaging available for new applications. This new acquisition strategy presents an advantage over conventional 3DFT even in those situations in which total scan time is not a concern. It gives more flexibility for trading off scan time for SNR.

SUMMARY OF THE INVENTION

Briefly, in accordance with the invention, spiral trajectories as used in 2D imaging are selectively employed so that the total scanned areas lie with a three dimensional volume such as a sphere or an ellipsoid or other geometric 3D volume.

In one embodiment of the invention, the trajectory is defined by a 2D planar spiral trajectory that traverses a plane, usually with more than one interleaf, such that the total scanned area is a circle. To get the three dimensional coverage the 2D trajectory is repeated at different rotation angles with respect to an axis in its plane. It is also possible to design the spiral such that the density of 2D coverage is reduced as it approaches the origin. This reduced density will be compensated by the oversampling produced by the rotation of the planes.

In accordance with another embodiment of the invention, planar spiral trajectories are employed to acquire different sections of the sphere or other geometric volume. Since sections which are farther away from the origin need to be smaller, the spirals are slightly different and require a different member of interleaves.

In another embodiment of the invention, k-space is traversed by a trajectory contained in surfaces from conic sections. Such a surface is defined as the surface generated when a line contained in a plane is rotated around an axis. Again, since the surfaces are closer together near the origin, each spiral can be designed such that the distance from turn to turn decreases as the trajectory moves further away from the origin. This compensates for surface separation and generates a more uniform sampling in k-space and also reduces the number of required excitations.

The invention and objects and features thereof will be more readily apparent from the following description and appended claims when taken with the drawings.

BRIEF DESCRIPTION OF THE DRAWINGS

FIGS. 1A–1D illustrate arrangement of conventional MRI apparatus and magnetic fields generated therein.

FIG. 2 is a functional block diagram of MRI imaging apparatus.

FIGS. 3A, 3B illustrate a spiral projection-reconstruction volume and spiral trajectory therein in accordance with one embodiment of the invention.

FIGS. 4A–4C illustrate T1-weighed images of a kidney acquired with spiral projection-reconstructions of FIG. 3.

FIGS. 5A, 5B illustrate a stacked spiral volume and a spiral trajectory therein in accordance with another embodiment of the invention.

FIGS. 8A, 8B illustrate a rectilinear family of conical trajectories and one spiral trajectory thereof for a 3D volume in accordance with another embodiment of the invention.

FIGS. 9A–9C illustrate an axial slice, a sagittal slice, a coronal slice of a 3D data set of a healthy heart using the volume illustrated in FIG. 8A.

DETAILED DESCRIPTION OF ILLUSTRATIVE EMBODIMENTS

Figure 4A:
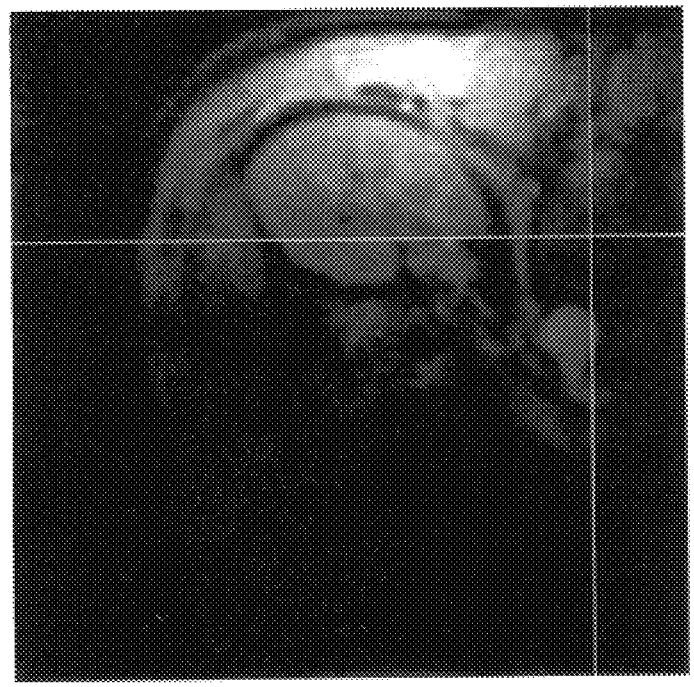

Referring now to the drawings, FIGS. 3A, 3B illustrate a spiral projection-reconstruction volume and a spiral trajectory therein in accordance with one embodiment of the invention. The trajectory is defined by a 2D planar spiral trajectory that traverses a plane, usually with more than one interleaf, such that the total scanned area is a circle. To get the three dimensional coverage the 2D trajectory is repeated at different rotation angles with respect to an axis in its plane. It is also possible to design the spiral such that the density of 2D coverage is reduced as it approaches the origin. This reduced density will be compensated by the oversampling produced by the rotation of the planes.

A 3DFT trajectory would require 10000 excitation (8.3 min.), whereas the spiral-PR hybrid only requires 1884 excitations (1.57 min.) for the following design parameters:

Field of view of 20×20×20 cm; resolution of 100×100× 100 pixels (2×2×2 mm); readout duration of 10.24 ms; repetition time of TR=50 ms; and hardware constraints given by, Max|$\overline{G}$|≦1 G/cm and $$\text{Max}\left|\frac{d\overline{G}}{dt}\right| \le 2G/\text{cm}/\text{ms}$$

This trajectory compares favorably in terms of flow characteristics by adding a phase encoding step to a 2D spiral acquisition. Designed for the same parameters, that technique takes 1200 excitations (1 min.).

Figure 4B:
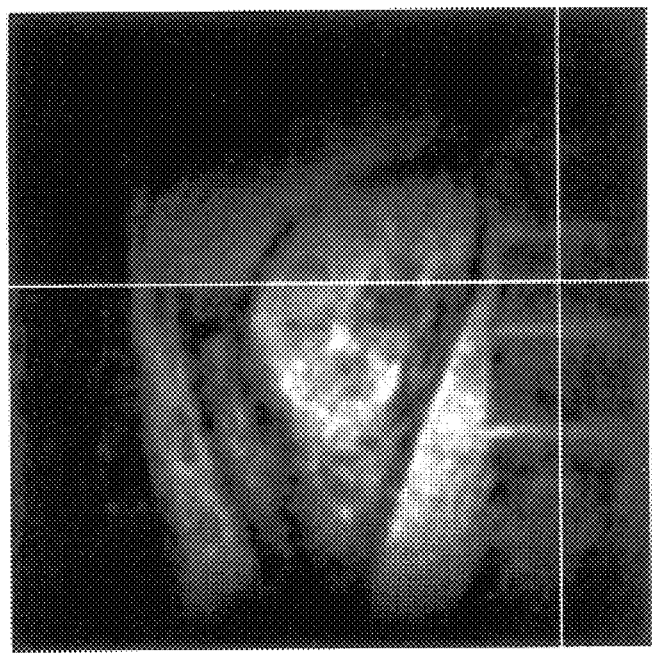

The sequence was implemented on a GE SIGNA 1.5T imager. A sample of a 3D image T1-weighted of the kidney is shown in FIGS. 4A to 4C. For the excitation, a spatial-spectral pulse was employed. See C. Meyer, J. Pauly, A. Macovski and D. Nishimura, *Magnetic Resonance in Medicine* 15, 287–304 (1990). FIGS. 4A–4C show three slices in the three orthogonal planes of a data set obtained from a healthy volunteer. The crosses indicate the intersection with the other two planes. These images were acquired with the parameters described above and are T1-weighed and acquired using the spiral-PR hybrid trajectory in 1 minute and 34 seconds. Each slice is a set of 100×100×100 pixels.

FIGS. 5A, 5B illustrate a stacked spiral volume and a spiral trajectory therein in accordance with another embodiment of the invention. This embodiment utilizes spiral trajectories that have been successfully employed for 2D imaging, for traversing 3D k-space. The region of interest in k-space is a sphere. This will produce isotropic resolution in that the impulse response will be radially symmetric. For non-isotropic field of view and/or resolution this region becomes an ellipsoid. Planar spiral trajectories will be employed to acquire different sections of this sphere. And, since sections that are farther away from the origin need to be smaller, the spirals will be slightly different and will require a different number of interleaves.

The stack of spiral with different number of interleaves requires only 870 excitations (43.5 s), whereas a stack of spiral with the same number of interleaves requires 1200 (1 min.). A 3DFT trajectory requires 10000 excitations (8.3 min.). These times apply for the following design parameters:

Field of view of 20×20×20 cm; resolution of 100×100× 100 pixels (2×2×2 mm); readout duration of 10.24 ms; repetition time of TR=50 ms; and hardware constraints given by, Max|$\overline{G}$|≦1 G/cm and $$\text{Max}\left|\frac{d\overline{G}}{dt}\right| \le 2G/\text{cm}/\text{ms}.$$

A stack of spiral with different number of interleaves trajectory was implemented on a GE SIGNA 1.5T imager with shielded gradients.

Figure 6A:
FIGS. 6A–6C illustrate an axial slice, a sagittal slice, and a coronal slice of a 3D data set of a head using the stacked spirals illustrated in FIG. 5.
Figure 6B:
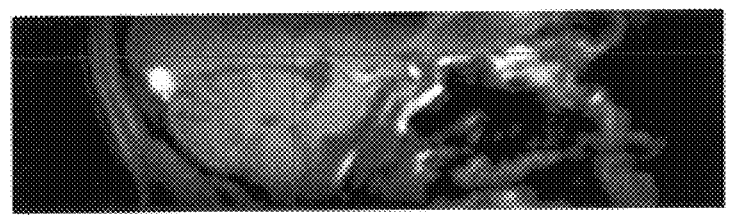
Figure 6C:
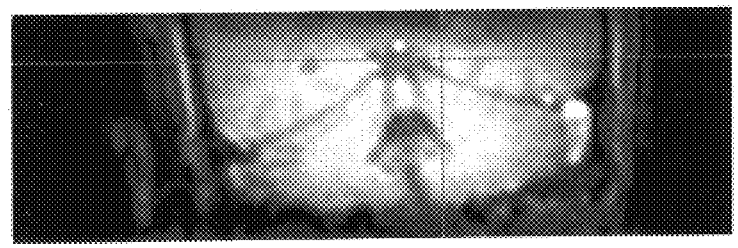

FIGS. 6A–6C show three slices in the three orthogonal planes of a data set obtained from the head of a healthy volunteer. The crosses indicate the intersection with the other two planes. The following parameters were employed: Field of view 30×30×7.5 cm; resolution of 200×200×50 pixels (1.5×1.5×1.5 mm); and a readout duration of 14.336 ms. This acquisition was done with only 928 excitations at a TR of 60 ms, that is 55.7 s.

Figure 7A:
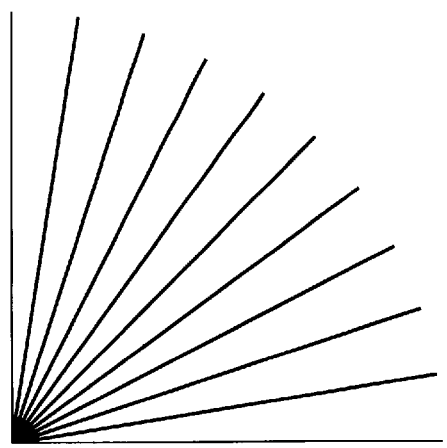
FIGS. 7A–7C illustrate generatrices for surfaces in conic sections.
Figure 7B:
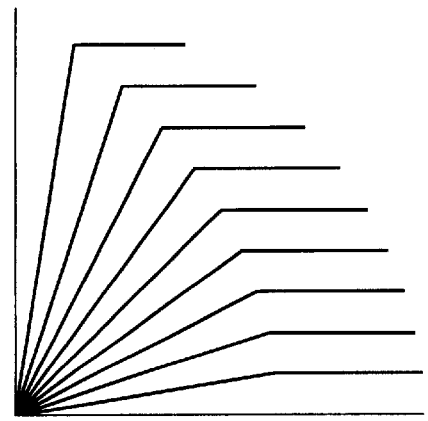
Figure 7C:
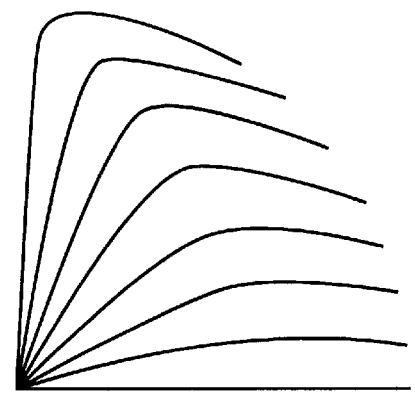

FIGS. 7A–7C illustrate generatrices for surfaces in conic sections which are coaxially distributed and define a volume in k-space which is traversed by spiral trajectories in accordance with another embodiment of the invention. A surface from the cone's family will be defined as the surface generated when a line contained in a plane is rotated around an axis. The generatrix starts at the origin and moves away from it. FIGS. 7A–7C show some examples of generatrices for a rectilinear case, a witch hat case, and a lily case, respectively. They are rotated around the vertical axis.

The trajectory contained in the surface is a planar spiral projected onto it. FIG. 8A depicts the case of rectilinear cones—the generatrix is a straight line. Since the surfaces get closer to each other as they approach the origin, it is possible to design a spiral as shown in FIG. 8B such that the distance from turn to turn decrease as the trajectory is farther away from the origin, and thus compensates for the surface separation. This generates a more uniform sampling in k-space and reduces the number of excitations.

Demonstrating the time savings, a rectilinear cone trajectory only requires 1186 excitations (59.3 s) without density compensation and 1114 excitations (55.7 s) with density compensation, whereas a 3DFT trajectory requires 10000 excitations (8.3 min.) for the following design parameters:

Field of view of 20×20×20 cm; resolution of 100×100×100 pixels (2×2×2 mm); readout duration of 10.24 ms; repetition time of TR=50 ms); and hardware constraints given by, Max|$\overline{G}$|≦1G/cm and $$\text{Max}\left|\frac{d\overline{G}}{dt}\right| \leq 2G/cm/ms.$$

The motivation for the other two examples of cone family trajectories, the witch hat and the lily is two fold: The surfaces themselves are more uniformly distributed—reducing the need for density compensation with the spirals—and they are better suited for non-isotropic field of view/resolution, while maintaining good flow properties.

A compensated rectilinear cone trajectory was implemented on a GE SIGNA 1.5T imager with shielded gradients. For excitation, a spatial-spectral pulse was employed.

Figure 9B:
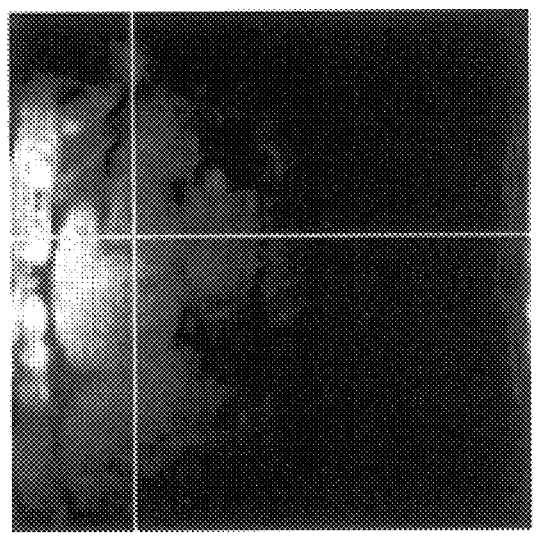
Figure 9C:
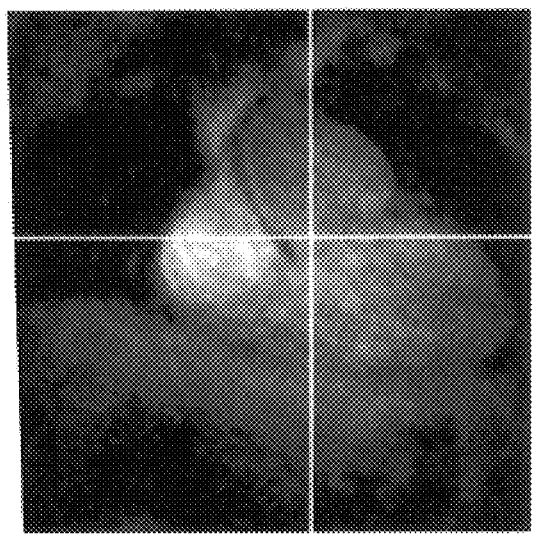

FIGS. 9A–9C show three slices in the three orthogonal planes of a data set obtained from the heart of a healthy volunteer. The crosses indicate the intersection with the other two planes. The following parameters were used: Field of view of 20×20×20 cm; resolution of 100×100×100 pixels (2×2×2 mm); and a readout duration of 14.335 ms. This acquisition was done with only 800 excitations. The sequence was cardiac gated, such that it took approximately 11 minutes. Since the sequence can be repeated every 50 ms, it was possible to fit many acquisitions per heart cycle (up to 16 for normal heart rates) to obtain a 3D movie with 100×100×100×16 [spatial elements×spatial elements×spatial elements×time elements].

Figure 10A:
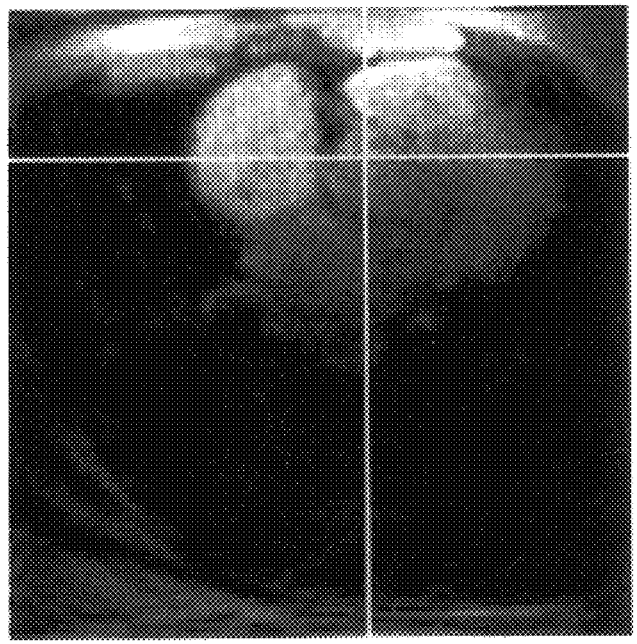
FIG. 10A illustrates an axial slice of a 3D data set of a healthy heart showing the proximal right coronary artery.
Figure 10B:
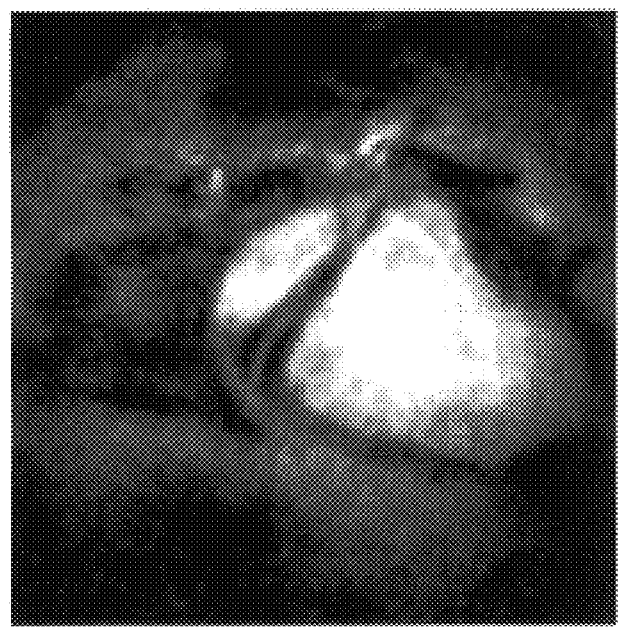
FIG. 10B illustrates a coronal slice of a 3D data set of a healthy heart showing distal portions of the right coronary artery and the left anterior descending coronary artery using the volume illustrated in FIG. 8A.

Although it was not the intention of the scan, it is possible to see long pieces of the right and left coronary arteries. In FIG. 10A the take off of the RCA is clearly seen. And in the coronal plane (FIG. 10B) more distal portions of the right and left arteries can be seen.

There has been described several embodiments of spiral trajectories for scanning three dimensional volumes in k-space for faster coverage of k-space and therefore reduce the total scan time and make 3 D magnetic resonance imaging more efficient. While the invention has been described with reference to specific embodiments, the description is illustrative of the invention and is not to be construed as limiting the invention. Various modifications and applications might occur to those skilled in the art without departing form the true spirit and scope of the invention as defined by the appended claims.

What is claimed is:

1. A method of three dimensional magnetic resonance imaging of a spheroidal or ellipsoidal volume comprising the steps of:
   a) placing an object to be imaged in a magnetic field,
   b) magnetically exciting nuclei in said object,
   c) detecting magnetic resonance signals in the presence of magnetic field gradients whereby the detected signals traverse a k-space trajectory through a volume to be imaged,
   d) repeating steps b) and c) whereby magnetic resonance signals are received from said object representative of a volume in k-space where said volume is traversed by spiral trajectories through said volume wherein each spiral trajectory has reduced k-space coverage as the trajectory approaches an origin of the trajectory and spiral trajectories for planar sections farther away from an origin of said volume have a reduced number of interleaved k-space trajectories, and
   e) obtaining a three dimensional data set from said magnetic resonance signals.

2. The method as defined by claim 1 wherein a planar spiral trajectory is repeated at different rotation angles with respect to an axis in the spiral trajectory in traversing said volume.

3. The method as defined by claim 2 wherein each planar spiral trajectory comprises interleaved spiral trajectories.

4. The method as defined by claim 1 wherein said spiral trajectories in k-space cover two dimensional planar sections in parallel alignment through said volume.

5. The method as defined by claim 1 wherein each planar section is traversed by a plurality of interleaved spiral trajectories.

6. The method as defined by claim 1 wherein said volume is defined by generatrices of a family of cones.

7. The method as defined by claim 6 wherein said generatrices are linear for rectilinear cones.

8. The method as defined by claim 6 wherein said generatrices each comprise a plurality of non-linear lines for witch hat cones.

9. The method as defined by claim 6 wherein said generatrices comprise curved lines for lily cones.

10. Apparatus for three dimensional magnetic resonance imaging of a spheroidal or ellipsoidal volume comprising:
    a) means for establishing a magnetic field through an object to be imaged,
    b) means for applying magnetic gradients through said object,
    c) means for applying excitation pulses to nuclei in said object,
    d) means for detecting magnetic resonance signals in the presence of magnetic gradients so that detected magnetic resonance signals traverse spiral trajectories in k-space through a volume to be imaged wherein each spiral trajectory has reduced k-space coverage as the trajectory approaches an origin of the trajectory and spiral trajectories for planar sections farther away from an origin of said volume have a reduced number of interleaved k-space trajectories, and
    e) means for imaging said volume using said detected magnetic resonance signals.

11. Apparatus as defined by claim 10 wherein a planar spiral trajectory is repeated at different rotation angles with respect to an axis in the spiral trajectory in traversing said volume.

12. Apparatus as defined by claim 10 wherein said spiral trajectories in k-space cover two dimensional planar sections in parallel alignment through said volume.

13. Apparatus as defined by claim 10 wherein said volume is defined by generatrices of a family of cones.

* * * * *